(12) United States Patent
Baumeister et al.

(10) Patent No.: US 6,515,898 B2
(45) Date of Patent: Feb. 4, 2003

(54) MEMORY ELEMENT, METHOD FOR STRUCTURING A SURFACE, AND STORAGE DEVICE

(75) Inventors: Bettina Baumeister, Wurenlingen (CH); Thomas A Jung, Thalwil (CH); Ernst Meyer, Muttenz (CH)

(73) Assignee: Paul Scherrer Institut (PSI), Villigen (CH)

( * ) Notice: Subject to any disclaimer, the term of this patent is extended or adjusted under 35 U.S.C. 154(b) by 0 days.

(21) Appl. No.: 09/804,984

(22) Filed: Mar. 13, 2001

(65) Prior Publication Data

US 2002/0131297 A1 Sep. 19, 2002

(51) Int. Cl.$^7$ ................................. G11C 11/36
(52) U.S. Cl. ......................... 365/174; 365/182
(58) Field of Search .................. 365/174, 182

(56) References Cited

U.S. PATENT DOCUMENTS 4,956,817 A * 9/1990 West et al. ............ 365/182
5,144,581 A * 9/1992 Toda et al. ............. 365/174

* cited by examiner

Primary Examiner—Trong Phan
(74) Attorney, Agent, or Firm—Rankin, Hill, Porter & Clark LLP (57) ABSTRACT

The invention is essentially characterized in that in a first step a substrate is provided, which is coated with defined pattern of protrusions of a coating layer of a different material, so that an interface is defined between the substrate and the coating layer. As an example, the patterned coating layer can be applied by first forming an essentially homogeneous coating layer, which is then partially removed by means of photolithographic and etching techniques, leaving nanometer sized protrusions in that layer. As a next step, the surface provided with these structures is modified by selectively removing protrusions by means of a micro-device. Such a micro-device can be formed in a similar way to a scanning probe microscope (SPM) tip. The presence or absence of a protrusion represents a readable data bit information.

17 Claims, 6 Drawing Sheets

MEMORY ELEMENT, METHOD FOR STRUCTURING A SURFACE, AND STORAGE DEVICE

BACKGROUND OF THE INVENTION

1. Field of the Invention

The invention is in the field of data storage and of micro-mechanical systems. It more particularly relates to a method of structuring a surface, a memory element, a storage medium as data carrier means, a data storage device, and a use of method of structuring a surface.

2. Description of Related Art

Due to increasing miniaturization in many technological fields, including data storage, techniques for applying specific microstructures in the submicron or micron range to surfaces has become increasingly important. An interesting technology in this context is the Micro Electro Mechanical Systems (MEMS). Another promising application field concerns the silicon-on-insulator (SOI) technology.

Known techniques for structuring and probing surfaces in the sub-micron region include Scanning Probe Microscopy (SPM), e.g. Atomic Force Microscopy (AFM) or Scanning Tunneling Microscopy (STM). These techniques serve as tools for investigating materials as well as for finding new materials or methods for the application in storage media.

An example of a storage device based on SPM is disclosed in U.S. Pat. No. 5,835,477. A device including arrays of SPMs is described. Perturbations on an essentially flat storage medium surface serve as data bits. Due to the multitude of SPMs, data bits can simultaneously be generated, erased or read. Examples of perturbations serving as data bits include indentations in a soft, wax-like material as well as locally modified chemical properties, domain structures, crystalline phases, polarization states, and electronic states. All the disclosed perturbations have in common that they are easily disturbed and that they have a rather limited lifetime. Especially, indentations in a wax-like medium are relatively quickly smeared out by the mechanical wear of the reading process.

MEMS sensors and actuators have become increasingly important. These systems are usually based on a microstructure of silicon and combine mechanical and electrical functions.

SOI (silicon on insulator) technology has recently gained considerable importance. SOI devices comprise a silicon oxide layer and a thin silicon layer on top of the silicon oxide layer. In this silicon layer, the transistor structure of a chip is formed. Compared to conventional chips built atop a crystalline silicon wafer, the charge-up process when a transistor is switched is done more quickly and efficiently and is less power-consuming.

When a SOI chip is built, in a first step the silicon-on-oxide structure has to be produced. To this end, two technologies are available: SIMOX (silicon implanted oxide) and bonded SOI. Both technologies have in common the disadvantage that the structure quality, and especially the interface quality, is difficult to control. It would therefore be desirable to have a method and a device that would allow testing of the interface quality of a silicon/silicon oxide interface.

SUMMARY OF THE INVENTION

It is an object of the present invention to provide a memory element that produces a reliable information bit with a long lifetime.

It is a further object of the present invention to provide a new method for structuring a surface on a micron or sub-micron scale that overcomes drawbacks of existing methods and which especially reliably produces a structured surface with information bits with a long lifetime. Preferably, the bits should be readable repeatedly an arbitrary number of times.

It is also an object of the invention to provide a storage medium and a storage device as well as a use for the method of structuring surfaces.

It is a further object of the invention to provide a method for manipulating a surface structure on a submicron or micron scale.

A basic memory element according to the invention is made up of a protrusion on a substrate, an interface being formed between the protrusion and the substrate. The protrusion can be broken off of the substrate by applying a force onto the substrate. The interface thereby serves as a predetermined breaking point. The memory element in this way serves as data bit: the information is given by the fact whether the protrusion is broken off or not.

The invention is based on the insight that an interface e.g. involving two different materials can serve as a well-defined area of fracture, i.e. as a predetermined breaking point. The protrusion is thus removed by simply applying a predefined, e.g. lateral, force onto the protrusion.

An idea underlying the invention is to make use of the non-volatile character of this information storage. Two examples:

A plurality of basic elements can make up a storage medium. A surface is structured by starting from a first structure, preferably a regular pattern of protrusions, and by selectively removing protrusions by a micro-device. The resulting data store is an example of an extremely reliable ROM (read only memory) that cannot be manipulated.

A basic memory element according to the invention can be combined with a micro electro mechanical sensor. Such a sensor may be formed as a protrusion with a sensor element. The sensor element causes the protrusion to be bent as a function of the quantity to be measured. If the protrusion is at the same time formed to be a memory element according to the invention, the protrusion is broken off if the measured quantity exceeds a certain value. The data bit contains then non-volatile information about the fact if the quantity has once been exceeded. In this way, a concept of 'threshold security' is introduced.

The method for structuring a surface is essentially characterized in that in a first step a substrate of a first material is provided, which is coated with a defined pattern of protrusions of a covering layer of a second material, so that an interface is defined between the substrate and the covering layer. As an example, a patterned coating layer can be applied by first forming an essentially homogeneous coating layer, which is then partially removed by means of lithographic and etching techniques, leaving nanometer sized protrusions in that layer. As a next step, the surface provided with these structures is modified by selectively removing protrusions by means of a micro-device. Such a micro-device can be formed in a similar way to a scanning probe microscope (SPM) tip. The presence or absence of a protrusion may represent a readable data bit information.

According to the method for manipulating a surface structure, one starts from a surface with a first structure of protrusions. The first structure of protrusions comprises a substrate of a first material that is partially covered by a covering layer of protrusions of a second material, so that an interface is formed between the substrate and the protrusions. The protrusions may be placed to form a pattern, e.g. produced by lithographic techniques. As an alternative, the structure of protrusions may comprise a different, non-periodic structure of protrusions or even consist of a single protrusion. In a next step, protrusions are removed by applying a pre-defined force.

A micro-device for breaking protrusions can also be used to probe the structured surface and to read data. More generally, data is usually read by probing the topography of the structure produced according to the invention. If the material of the substrate and the material of the protrusions differ from each other in physical or chemical properties, e.g. their magnetic or electric properties, the surface structure can also be probed using differences in these physical or chemical properties between the protrusions and the other parts of the surface.

In a preferred embodiment of the present invention, silicon is used as a substrate and silicon oxide as protrusion material. It has surprisingly been found that the $Si/SiO_2$-interface is very well suited for the purpose of forming a predetermined breaking point. The force needed to break off the oxide protrusions is relatively small compared to the force needed to break a pure silicon oxide or silicon structure and very well defined, so that the structuring process can be optimally controlled.

According to further preferred embodiment, substrate and protrusions are both formed from silicon. An ultrathin oxide interface layer then forms the interface. Such an interface layer may, during an etching preparation step, also serve as etch stop. Ultrathin layers of silicon oxide embedded in silicon are nowadays available on the market due to the progress made in the SOI (silicon on insulator) technology.

Of course, any known or yet to be discovered substrate/ coating layer material combination can be used, as long as a well-defined interface is formed. Different materials in the sense of this description also include one material with different additives or dopants or one material in different modifications such as carbon as diamond, graphite, amorphous carbon, etc.

An advantage of a surface or a data storage medium fabricated according to the present invention is that the structure or medium is extremely stable. There are, for example, no volatile materials or electronic or magnetic features that can easily be manipulated. If for the reading process a probe similar to an AFM tip or an array of AFM tips is used, the protrusions are essentially not altered at all. The information can thus be read arbitrarily often. If the appropriate materials are chosen, the storage medium according to the invention is thus a well-suited medium for WORM (write once read many times) applications. Further, once the information is written on the storage medium, it cannot be altered any more except by removing other protrusions as well, i.e. by destroying the medium. The structure or information is, so to say, 'chiseled in stone'. The method and storage medium according to the invention is thus extremely well suited for applications where security is a major issue.

For instance, the method and the storage device may be based on an array of micro-devices as disclosed in U.S. Pat. No. 5,835,477. Compared to existing storage devices, a significant improvement with respect to data access rate results.

According to a special embodiment, a pattern of protrusions is provided where each protrusion comprises a plurality of predetermined breaking points. The predetermined breaking points are configured so that, if a force is applied onto the protrusion, breaking off is done at one predetermined breaking point after the other. In this way, a storage medium can be altered to form a WSRM (Write Several times Read Many times) medium.

The structuring method according to the invention further gives rise to progress in investigation methods as well. It allows the investigation, e.g. by means of SPM probes, of physical or chemical properties of protrusions, e.g. of the mechanical stability, friction erosion, etc. In addition, and possibly even more importantly, this method opens up new possibilities in the field of nanotribology and the studying of interfaces in a submicron range, which is of growing interest i.e. for micromechanical systems. For example, by systematically measuring forces to be applied to break off a protrusion, a new access to interface adhesive forces and stability as well as interface sharpness is gained.

BRIEF DESCRIPTION OF THE DRAWINGS

In the following, preferred embodiments of the invention are described with reference to drawings. In the drawings, FIG. 1 schematically shows a first example of a one-bit memory element in section, FIG. 2 represents a second example of a one-bit memory element in section, FIGS. 3a through 3c schematically show a storage medium comprising a plurality of one bit memory elements during different stages of the patterning step, FIG. 4 very schematically shows a view of the storage medium during the step of selective removal of protrusions

DESCRIPTION OF THE PREFERRED EMBODIMENTS

For the method of storing a data bit, for the memory element, for the method for structuring a surface structuring method and the surfaces structured according to the present invention, various known material handling and manipulating as well as surface probing and manipulating techniques can be used. In the following, some preferred embodiments of the present invention and of these techniques are described.

Figures 1, 2:
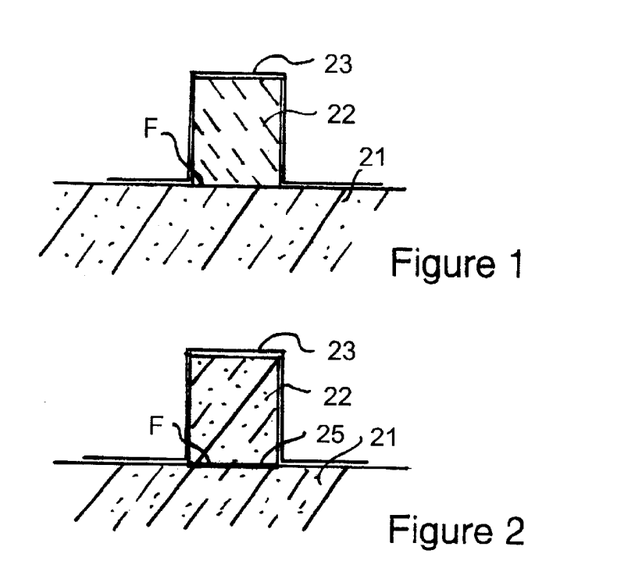

In FIG. 1 a protrusion 22 on a substrate 21 is shown. The basic memory element stores the information bit, whether the protrusion is present or broken off. The two states of an information bit are often referred to as "0" and "1" or as "true" and "false". It goes without saying—as also will further be exemplified below—that any two-state-information can be stored by such a data bit. The protrusion is, for example, formed from a second material, which is different from the (first) substrate material. An interface F forming or defining a predetermined breaking point is formed between the first and the second material. As an example, the first material may be silicon, the second silicon oxide. There are, however, many alternatives for both materials, e.g. other semiconductors such as Gallium Arsenide, Germanium Zinc Selenide etc, as well as many insulators including silicon compounds such as Silicon Nitrides etc., but also polymers, any organic material etc. The memory element shown in FIG. 1 further comprises a conductor path 23 between two sides of the protrusion and leading via the protrusion. The presence or absence of the protrusion can thus be determined, for example by measuring the electrical resistance between two contacts contacting each side of the conductor path. The memory element, so to say, forms a bit of a mechanically erasable programmable read only memory.

The memory element shown in FIG. 2 is similar to the one in FIG. 1. The substrate material and the protrusion material, however, are identical. As an example, they both may be silicon. The interface is formed by an ultrathin interface layer 25 of Silicon Oxide. The interface layer thickness may, for example, be in the range of 1 to 10 atomic layers. Substrates comprising thin silicon oxide layers embedded in silicon are available on the market due to the SO1 technology.

Figure 3A:
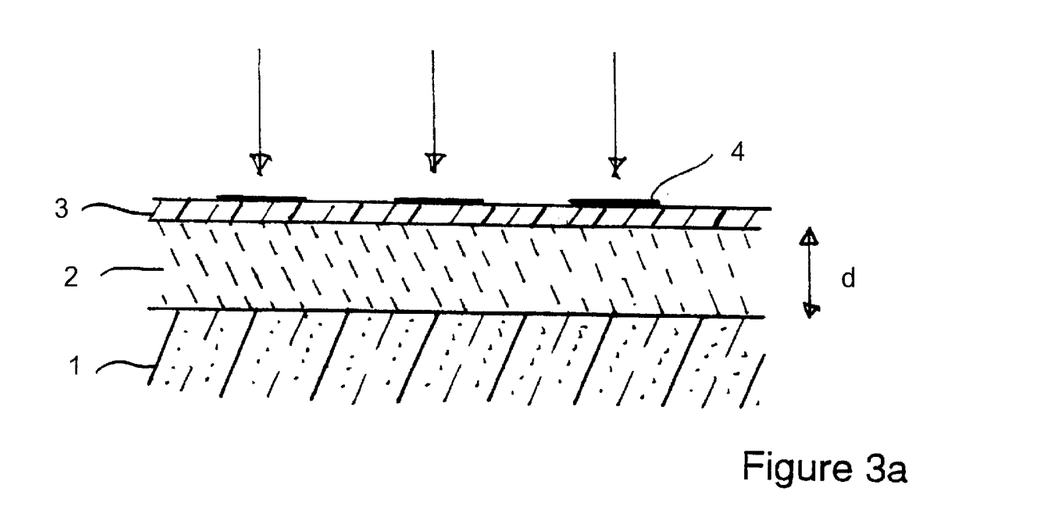
Figure 3B:
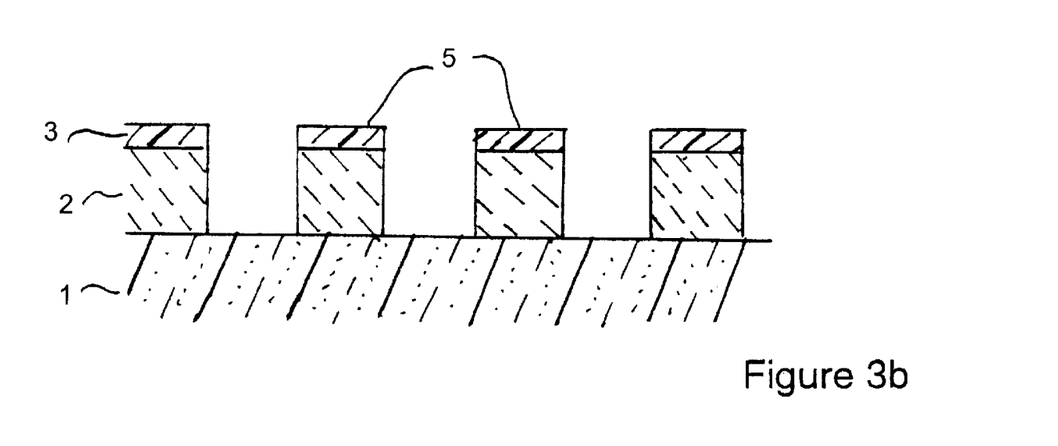
Figure 3C:
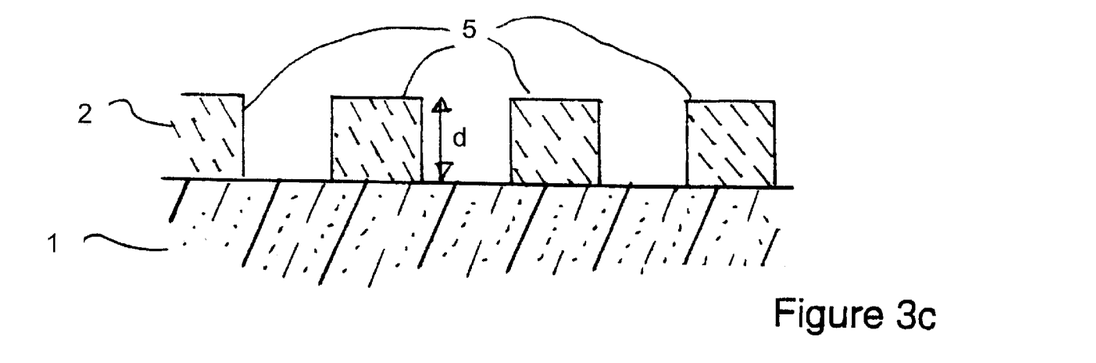

FIGS. 3a–c show the first steps of preparing a storage medium comprising a plurality of memory elements. The storage medium comprises a substrate of a first material coated by a layer of a second material, which is distinct from the first material. An interface is formed between the substrate and the layer, which may serve as predetermined breaking point for a controlled removal of protrusions of a predefined pattern. The layer can be applied to the substrate in any known way. It can e.g. be grown by deposition, e.g. sputtering, vapor deposition (PVD(physical vapor deposition) or CVD (chemical vapor deposition)), oxidation, applied by semiconductor or galvanization or electroplating techniques etc. A layer—possibly directly structured or patterned—further can be manufactured by any lithographic technique, by (hot or cold) embossing, by stamping etc.

On the conventional silicon wafer substrate 1 in FIG. 3a, an oxide layer 2 is grown by oxidizing the silicon. The thickness d of the oxide layer is well defined and lies for instance in a range of d=10–200 nanometers, e.g. around d=120 nm The techniques to grow an oxide layer of a defined thickness on silicon are well known in the art and can be performed by e.g. oxidizing, sputtering, heating, chemical treatment, etc.

To provide the silicon oxide layer 2 with a defined pattern 4, a photoresist layer 3 is applied onto the oxide layer 2. Then, this resist layer is selectively exposed to visible, ultraviolet or possibly infrared light. The exposed spots are either made sensitive or resistant for the following etching process depending on whether a positive or negative photoresist is used. This selective exposure is preferably done by a light interference process: only those parts of the resist layer 3 are exposed where light constructively interferes. The exposing of the resist layer defines the size and shape of the pattern 4. The wavelength of the used light source can be chosen so that a small range patterning of the surface is achieved. If, for instance, a UV light source is chosen, a patterning in the range of only tens of nanometers is attained. In a next step, as shown in FIG. 3b, the photoresist 3 and silicon oxide layer 2 are etched away according to the selective light exposition of the resist layer 3. Protrusions 5 with a height d of about 120 nm and a protrusion to protrusion distance of about 200–400 nm or more are left. After removing the rests of the photoresist 3, the well defined structured surface with a silicon substrate 1 and oxide protrusions 5 in a submicron range is prepared, as can be seen in FIG. 3c. A photoresist layer is applied onto the layer to be patterned.

Using this interference technique, the exposed regions can be made even smaller than the wavelength of the light used for the exposing process. It, however, is also possible to use different lithographic techniques to produce a pattern. Next to all sorts of electromagnetic radiation, such as visible, ultraviolet, and possibly even near infrared light as well as x-rays, also particle radiation may be used to implement a pattern on a resist layer. Examples for such particle radiation comprise electron radiation, ions, neutrons, protons etc.

Figure 7:
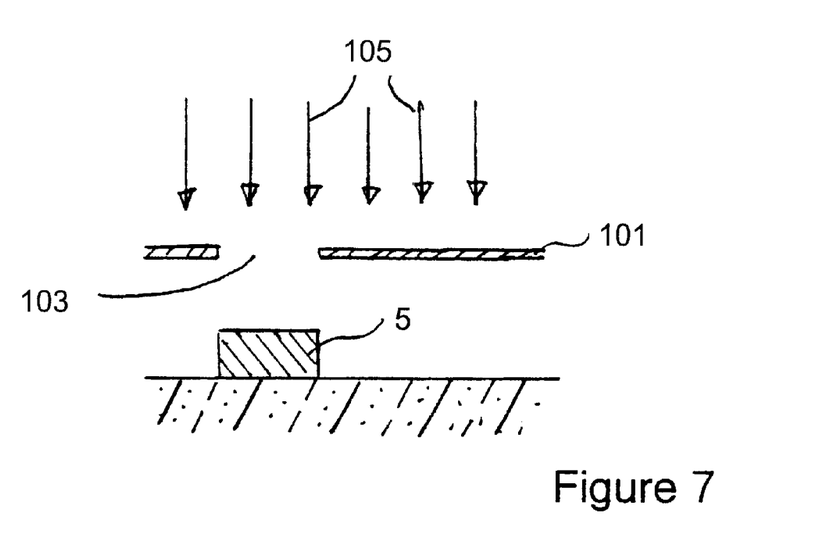
FIG. 7 shows the principle of preparing a pattern or a first structure using a mask, FIGS. 8 and 9 each schematically show a cross section of two different protrusions with a plurality of predetermined breaking points.

In the lithographic techniques described above, in a first step an essentially homogeneous, unstructured layer of the second material is applied to the substrate. The layer is then structured in the manner described in one of the following sections. However, it is also possible to directly apply a structured layer to the substrate surface. Any known technique can be used for this, e.g. using a mask together with one of CVD, PVD, MBE (molecular beam epitaxy), of ion beam sputtering and of spin coating. The principle of preparing a pattern of protrusions using a mask is represented in FIG. 7. A mask 101 has openings 103 through which an ion beam 105 is directed so that protrusions 5 are produced.

Finally, it is also possible to use the same material for substrate and structures, i.e. to fabricate a predefined structured surface in a first step in a homogeneous material. This can, for example, be done by photostructuring and etching. In a second step, the protruding structure material is modified so as to create an interface between the substrate body and the structure. To this end, the substrate may be heated until a phase transition temperature is reached. Another possibility for modifying the structure material is ion implantation into the structure to produce an interface that serves as a weak link or that makes the material sensitive for any following process e.g. a heating process as previously mentioned.

The lithographic technique based on light interference necessarily creates a regular pattern starting from which structure may be produced using the method according to the invention. However, if other techniques are applied, any structure serving as first structure to be manipulated using the method according to the invention can be produced including a non periodic structure. These other techniques include the above described mask technique as well as a technique using a mold or any scanning lithographic technique such as a scanning x-ray beam or a scanning electron beam technique.

As to the materials involved, a preferred embodiment of the present invention uses hard materials like silicon and silicon oxide. The structure forming an information thereby does not erode or wear away when scanned with any appropriate scanning technique. However, the method of structuring a surface according to the present invention is not restricted to hard materials. It can also be used on any other materials as long as predetermined breaking points can be formed. For example, the use of metals brings about the advantage of an electrically conductive surface. In addition, any combination of insulators, semiconductors, metals, polymers or organic substances that form interfaces as weak links can be used.

Figure 4:
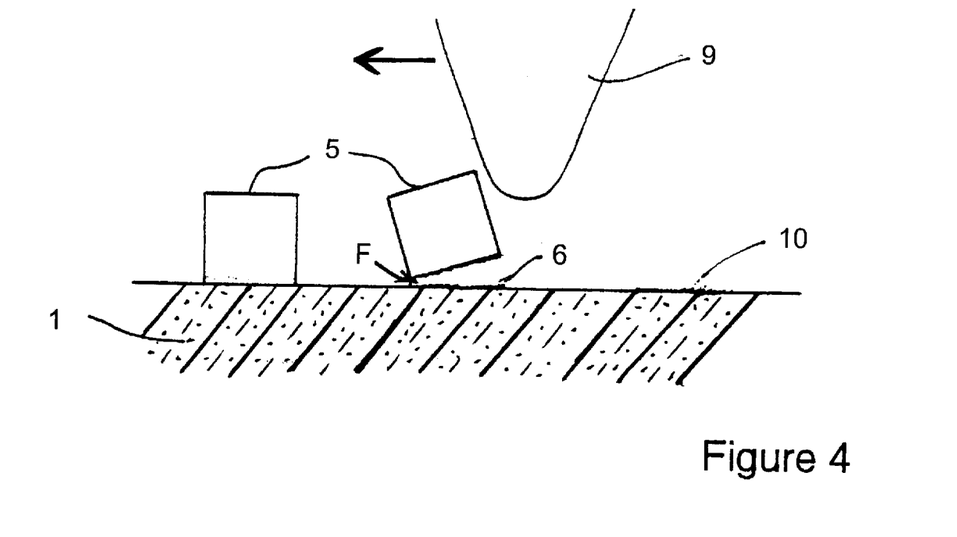

FIG. 4 shows a view of a sample in partial section during the breaking off process. The tip 9 of an atomic force microscope (AFM) is moved along the structured surface in a controlled manner. More general, as examples of microdevices used for probing and structuring a surface conventional scanning probe microscopes (SPM) can be used, such as atomic force microscopes (AFM) or scanning tunneling microscopes, (STM). SPMs are provided with a probing device, such as a cantilever or a tip, for probing a medium surface. SPMs are able to probe and alter a surface in a nanometer range without changing the probing setup. The interaction between tip and sample is measured and, depending on the chosen measuring technique, i.e. AFM or STM, different signals like atomic force, frequency, light deflection, voltage or current, are detected. For the method of the present invention, preferably an AFM or the like is used, an STM being restricted to the use of conductive materials. For probing the surface before and after the structuring according to the invention, other scanning techniques can also be utilized, e.g. optical methods like scanning near field optical microscopy (SNOM) or scanning by a focussed short-wavelength laser beam. This especially holds for the reading process if the structured surface is to be a data storage medium. The applied method is essentially dependent on the materials used and is accordingly optimized. Especially, in a storage device e.g. a setup based on AFM technology and comprising an array of cantilevers may be used. Compared to the existing AFM technology, of course, parameters such as resolution etc. may be adapted to the specific requirements of a storage device and may require less sophistication than a cantilever of an AFM serving for scientific purposes.

Cantilevers and tips as probing devices are well known elements. In principle, a cantilever is a kind of an indication or transfer means: it is flexible up to a certain degree to indicate e.g. the topography or the attractive or repelling forces of a sample sensed by the tip. Cantilevers are preferably fabricated by semiconductor processes, e.g. wet etching of silicon substrates or other semiconducting materials. Another possibility is to use a bimetal which is bent if a voltage is applied. In that case the deflection of a cantilever is mostly detected by measuring voltage differences. Vice versa: a cantilever can be deflected by applying a voltage. Typical tip materials are e.g. tungsten, iridium, platinum, silicon, diamond etc. The tip is preferably prepared by wet or dry etching processes that give very sharp tips with tip radii≅50 nm. Sample approach and scanning is typically performed by motors for a coarse approach and piezoelectric means for a fine approach. The scanning of a sample can be done either by moving the sample or by moving the local probe. The scanning is preferably done line by line in an x-y-direction, where a possible movement in z-direction, i.e. perpendicular to the surface, indicates a sample signal.

Returning to the figure, the tip 9 mounted on a cantilever is regulated by the control mechanism in the AFM. It is scanned over the surface in the direction of the arrow in such a way that it exerts a controlled force onto the individual protrusions 5. If the force is high enough the protrusion 5 breaks off at the area of fracture F as predetermined breaking point. The Si/SiO$_2$ interface 6 thereby acts as the weak link. It is observed that the force needed to break off the protrusions 5 is rather well defined and nearly constant for each protrusion of equal dimension. This indicates that also the Si/SiO$_2$ interface is well defined.

After the removal of the protrusion 5 an 'empty' region 10 is left, exposing the initial silicon substrate 1, possibly covered with a thin oxide layer. The control mechanism of the AFM allows the selective breaking off or not breaking off of protrusions 5. With this method, a surface can selectively be manipulated to form a structured surface. If the surface is textured with a regular pattern 4 of protrusions 5, the single protrusions 5 can represent information on that surface according to the existence or absence of protrusions 5: each protrusion or missing protrusion represents one data bit. The same tip 9 that is used to create a structured surface can in principle also be used as probing tip 9. The data bit information on the surface is e.g. read by scanning over the surface. The information is characterized by the detected signal according to the topography of the surface. The structured surface as described is mechanically and chemically extremely stable. The hard materials, silicon and silicon oxide, do not wear away with a frequent reading process. Silicon also passivates by itself, or can be passivated, with a natural oxide layer of about 20 nm, which is chemically stable.

Figure 5A:
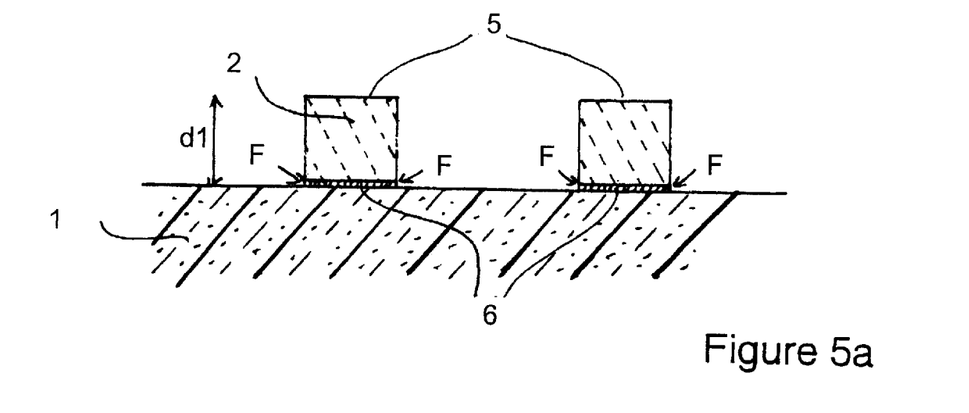
FIGS. 5a and 5b, show cross sections of nanostructures with different etching depths, FIG. 6 very schematically shows a perspective view of a part of a structured surface during a data reading process.
Figure 5B:
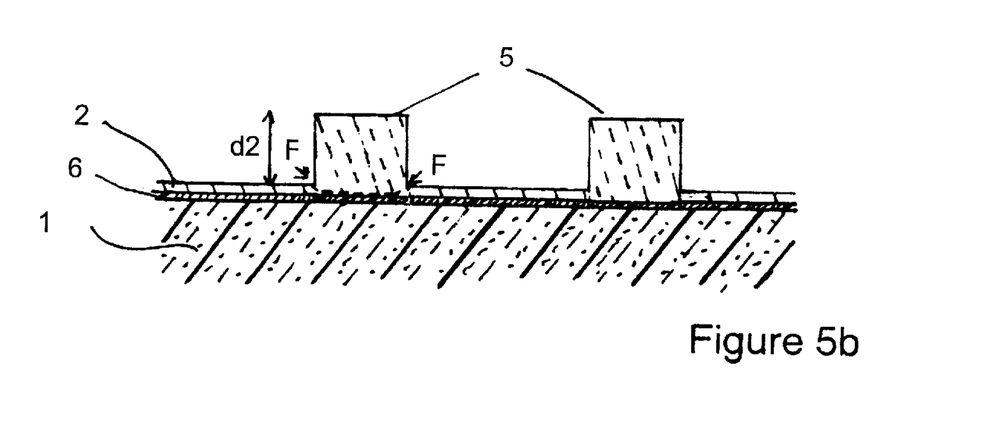

It is observed in experiments that the breaking off of silicon oxide protrusions 5 is very sharp and well defined and not sensitive to the etching depth. In FIGS. 5a and 5b two different etching depths $d_1$, and $d_2$ are shown. In FIG. 3a the oxide layer 2 next to the protrusion 5 is completely etched away leaving the Si/SiO$_2$ interface 6 partially freely accessible. In FIG. 3b this oxide layer 2 is not completely etched away, leaving a small oxide layer on the substrate. The dotted line indicates the predetermined breaking point F. The Si/SiO$_2$ interface 6 is covered by silicon oxide and not as freely accessible as shown in FIG. 3a. However, the interface is still the 'weak link'. Experiments show that such differences in etching depths $d_1$, $d_2$ do not prevent or disturb the breaking off process of such nanostructures 5.

Figure 6:
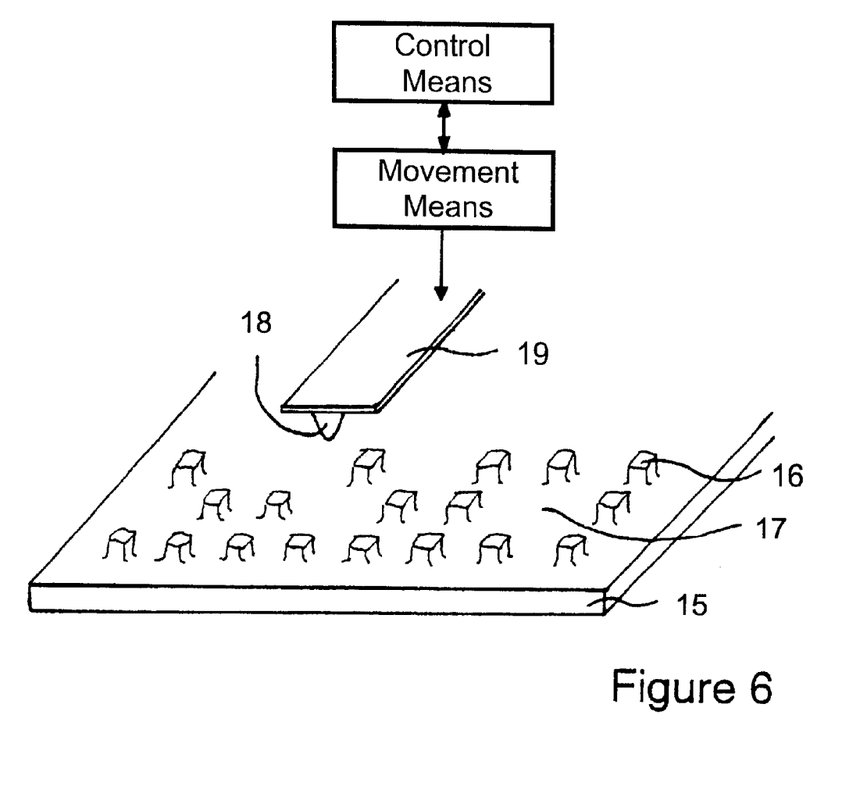

FIG. 6 shows a perspective view of a part of a probing arrangement of a structured surface. A substrate 15 having protrusions 16 and empty spaces 17 where protrusions have been broken off, is probed with a tip 18 of a cantilever 19 both being part of a scanning probe microscope (not shown). Movement of the micro-device probe, represented by the cantilever 19 and tip 18, is provided by a movement means, the operation of which, in turn, is controlled by a control means. Each protrusion 16 or missing protrusion 17 is detected by the SPM tip. The movement, i.e. the bending, of the cantilever 19 gives a signal according to the varying topography of the surface. If the structured surface serves a storage medium then the individual protrusions 16 or missing protrusions 17 represent single data bits, i.e. the stored information on that surface.

Figure 8:
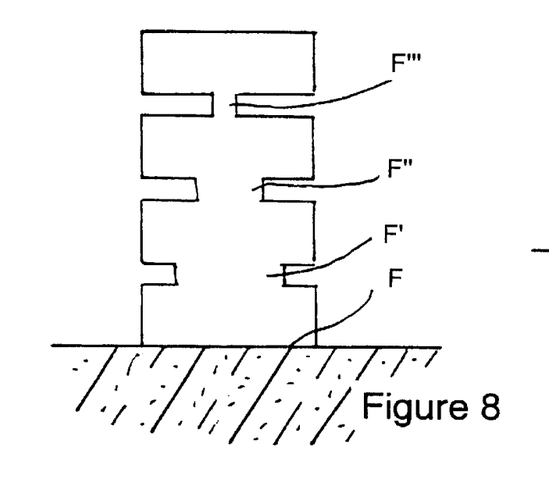
Figure 9:
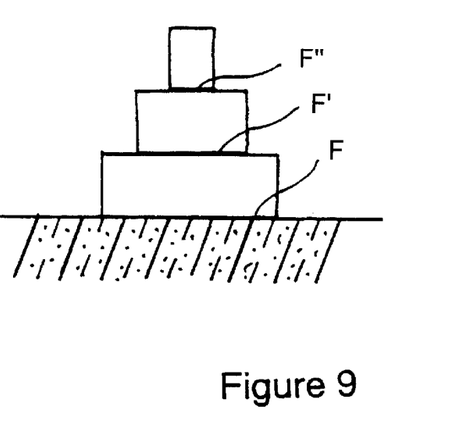

The protrusions shown in FIG. 8 and in FIG. 9 comprise a plurality of predetermined breaking points instead of just one.

In FIG. 8, the additional predetermined breaking points F', F" and F'" are caused by circumferential indentations at different heights of the protrusion.

In FIG. 9, the additional predetermined breaking points F' and F" are caused by embedded SOI interface layers in otherwise essentially homogeneous Silicon.

Due to the plurality of predetermined breaking points, an example of a WSRM (Write Several Times Read Many Times) storage medium may be formed.

Next to data storage media and devices, the method of structuring a surface can be used also for other applications. These include micro mechanical devices, field emission probes and actuators. Further, the production of nanostructured masterpieces such as moulds for reproducing a structure is possible. The forming of reproduced structures then is done according to the state of the art. For instance, an Si/SiO$_2$ sample as previously described can be coated by a very thin metal layer and then reproduction by electroforming can be carried out. One masterpiece produced by the method according to the invention can be used to manufacture a large number of ROM (Read only Memory) storage media.

Figure 10:
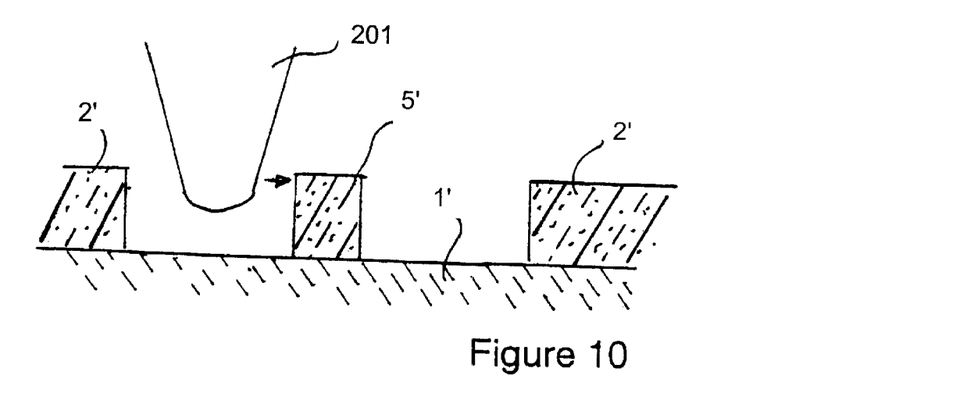
FIG. 10 represents a schematical cross section of the principle of a SOI interface quality testing device.

A further embodiment of the invention relates to SOI technology. It is described with reference to FIG. 10. A device for controlling interface quality comprises means for producing a first structure with at least one protrusion 5'. These means for producing a first structure is based on one of the principles previously outlined and is not described in more detail here. The device further comprises a force measuring means 201, schematically sketched as cantilever tip. For carrying out a quality test, one starts e.g. from mass produced SOI setup with a Silicon oxide substrate 1' and a silicon layer 2' on top of it. The setup is in a first step provided with the structure comprising the protrusion 5'. Then the first structure is manipulated in a way that the protrusion 5' is broken off by the measuring means 201. The thus-measured force is a measure for the interface quality and, therefore, for the entire SOI structure quality. The force measuring means comprised in the measuring means 201 may determine a force value based on the bending of a cantilever like element. Alternatively, the measuring means may apply a predetermined force. If the protrusion is broken off by this force, the sample fails the quality test, otherwise it passes.

A memory element can also be combined with a MEMS sensor to form a measuring device with a 'threshold security' feature. The information bit then comprises the information about whether a quantity—measured by the sensor—has ever exceeded a certain value (threshold value). If it has, the original state of the memory element can only be restored if the entire element is replaced. In this way, manipulation of the memory element is prevented.

The MEMS sensors described in the following are based on the principle a quantity to be measured causes a mechanical deformation of a microstructure, i.e. a bending of a protrusion. All of the following sensors comprise means (not shown in FIGS. 11–15) for determining how much the protrusion has been deformed. Such sensing means are as such known in the art and may e.g. comprise a beam deflector, capacitance measuring means, an interferometer, etc.

Figure 11:
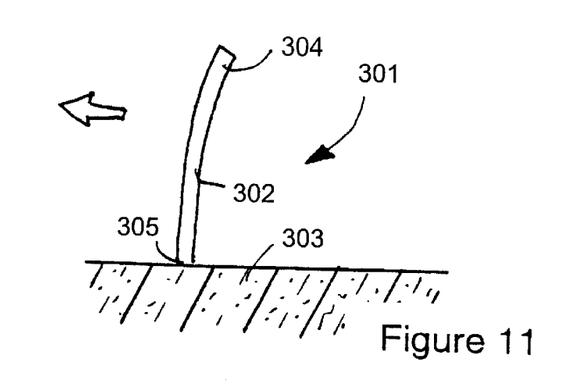
FIGS. 11 through 15 show schematical cross sections of the principle of a MEMS accelerometer, a device for measuring electric fields, a device for measuring magnetic fields, a MEMS thermometer, and a MEMS hygrometer/flow meter, and FIG. 16 schematically shows an alternative geometry for one of the above memory elements.

An example of such a method and device is shortly described with reference to FIG. 11. In a very schematical way, a device of measuring accelerations (accelerator) is shown. Such a device can, according to the state of the art, e.g. be found in cars or in elevators. Using such a device, the acceleration value is determined and from this it is concluded if an accident has taken place (and e.g. an airbag has to be inflated), or the event of an earthquake is detected.

After an incident, using a possibly damaged device, e.g. a car or an elevator, may be hazardous. The concept of a memory element that stores the information whether an acceleration exceeding a certain value has been experienced introduces additional security element.

An accelerometer works based on inertia. It comprises a sensor 301 with a flexible portion 302 fixed to a sensor body 303 and a sensing portion 304 fixed to the flexible portion 302. When the sensor body 303 is accelerated, due to the inertia of the sensing portion and the flexible portion 302 and due to the flexibility of the flexible portion, the flexible portion is bent and the sensing portion 304 is displaced with respect to the sensor body 303. This displacement, being a measure of the acceleration, may be determined. The sensor portion 304 may or may not be part of the flexible portion 302. An example of a device for determining forces on a micrometer scale now comprises an interface 305 forming a predetermined breaking point. If the acceleration exceeds a certain threshold value, the flexible portion 302 and/or the sensor body 303 break off at the predetermined breaking point rendering the device unusable. By means of determining the material and dimension parameters, the threshold force—corresponding to the threshold acceleration—can be tuned.

The accelerometer can electronically be coupled to the device, e.g. car or elevator, in which it is placed. As an example, a warning signal informing users about possible hazards can then be produced. As an alternative, the device, e.g. an elevator, may not work at all until service personnel have thoroughly inspected it and replaced the accelerometer. In this way, the embodiment of the method of determining forces introduces the concept of 'threshold security'.

It goes without saying that the determination of angular velocities is from a certain point of view equivalent to the determination of acceleration and can be done completely analogously to the above acceleration determining procedure. If the radius of the motion of the accelerometer is known, from the centrifugal acceleration the angular velocity may readily be determined.

In the following FIGS. 12 through 15 memory elements coupled with different MEMS sensors are shown. These devices work analogous to the accelerometer with threshold security. Only the origin of the force that causes the protrusion to bend and eventually to break off at the predetermined breaking point varies. The devices of FIGS. 12–15 can all be used to introduce a threshold for a certain quantity, of which a certain value should not be exceeded under normal conditions.

Figure 12:
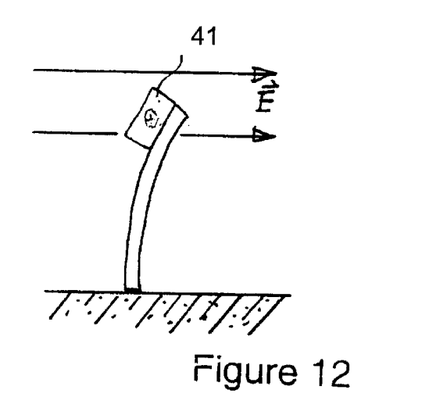
Figure 13:
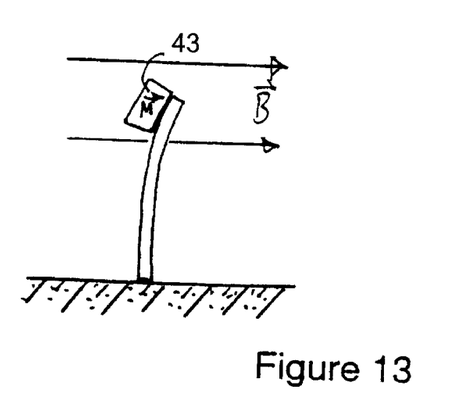

The protrusions of FIGS. 12 and 13 comprise an element 41, 43 upon which a force is exerted when it is subjected to an electric or magnetic field, respectively. This element may be electrically charged (via a conductor path, not shown or due to its chemical composition), or be a permanent electric or magnetic dipole, respectively. For example, the protrusion may comprise a ferromagnetic element 43, so that the protrusion bends when exposed to a magnetic field, as illustrated in FIG. 13.

In the drawings, the sensor elements 41, 43 are shown to be separate elements arranged at the protrusions. However, the elements 41, 43 may also be formed by the protrusions themselves.

Figure 14:
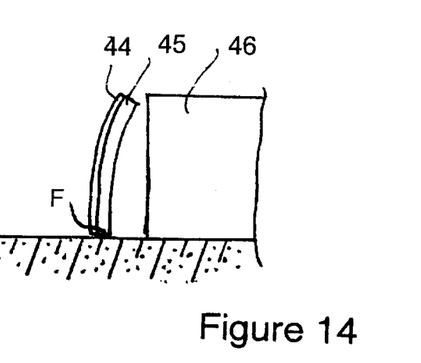

The protrusion of the memory element of FIG. 14 is a bi-metal protrusion having two layers 44, 45 of different materials. If these two materials have differing coefficients of thermal expansion, the device works as thermometer. If the protrusion is heated, it bends. One of the two layers 44, 45 may, however, as an alternative be porous and able to absorb a fluid. The strain in the sensitizing layers and thus the bending of the protrusion is then e.g. dependent on the concentration of a certain substance in the fluid, a chemical composition. In this way, the element of FIG. 14 becomes a chemical sensor (NOSE-technology). The memory element of FIG. 14 further comprises a stop block 46. If the bending of the protrusion exceeds a certain value, it adjoins the stop block 46 and finally breaks off at the interface F.

Figure 15:
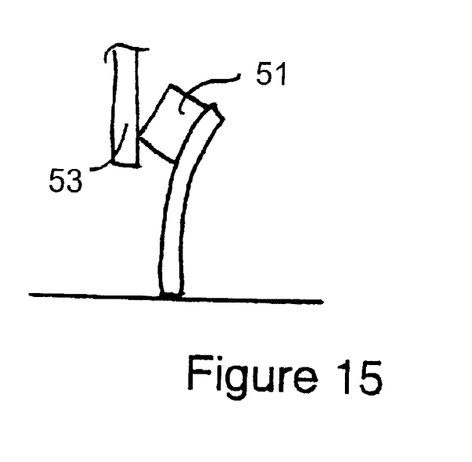

The protrusion of the memory element of FIG. 15, finally comprises a conjunction element 51 for cooperating with a membrane 53. If pressure is exerted on the membrane—e.g.

because of different fluid pressures on either side of the membrane or because of a fluid flow through the membrane or along the membrane—a force is applied on the protrusion. If this force exceeds a certain value, the protrusion breaks off.

Figure 16:
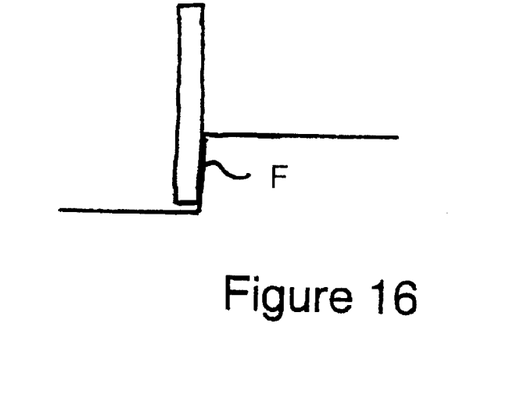

Of course, the above concepts are not restricted to the described examples. In particular, next to different materials, measuring methods, manufacturing methods, etc, also different geometries are possible. An example of a different geometry is shown in FIG. 16, wherein the interface F is placed laterally.

Numerous other embodiments may be envisaged, without departing from the spirit and scope of the invention.

What is claimed is:

1. A method for storing an information bit comprising the steps of
    providing a substrate of a first material,
    said substrate comprising a protrusion of a second material, an interface being formed between said substrate and said protrusion,
    depending on whether the information is "0" or "1", breaking off or not breaking off said protrusion, by applying a pre-defined force,
    said interface serving as predetermined breaking point.

2. A method as claimed in claim 1 wherein said interface is formed using silicon on insulator (SOI) technology.

3. A memory element comprising
    a substrate of a first material,
    said substrate comprising a protrusion of a second material, an interface being formed between said substrate and said protrusion,
    said interface being a predetermined breaking point for a breaking off process,
    means for determining whether said protrusion has been broken off and for determining an information bit to be "1" or "0" depending on whether said protrusion has been broken off or not.

4. A memory element as claimed in claim 3 wherein said means for determining whether said protrusion has been broken off comprise a conductor path on said protrusion which is interrupted if the protrusion is broken off.

5. A memory element as claimed in claim 3 wherein said means for determining whether said protrusion has been broken off comprise an atomic force microscope tip.

6. A memory element as claimed in claim 3 wherein one of said first and said second material is silicon and the other one of said first and of said second material is silicon oxide.

7. A memory element as claimed in claim 3 wherein said interface is formed by a ultrathin silicon oxide layer embedded between said first material being silicon and said second material being silicon.

8. A memory element as claimed in claim 3 wherein said protrusion is a micro electro mechanical sensor means and wherein said information bit comprises information about whether a measurable quantity has exceeded a certain value.

9. A memory element as claimed in claim 8 wherein said protrusion comprises one of a chargeable conductor element and a ferroelectric element so that the protrusion bends when exposed to an electric field.

10. A memory element as claimed in claim 8 wherein said protrusion comprises a ferromagnetic element so that the protrusion bends when exposed to a magnetic field.

11. A memory element as claimed in claim 8 wherein said protrusion comprises a mass element so that the protrusion bends when accelerated or subjected to a circular motion.

12. A memory element as claimed in claim 8 wherein said protrusion comprises a bi-metal element so that the protrusion bends when subjected to a temperature change.

13. A memory element as claimed in claim 8 wherein said protrusion comprises a conjunction element for working with a membrane such that said protrusion bends if said membrane is subjected to a pressure or if said membrane is subjected to a fluid flow through it.

14. A write once read many times (WORM) data storage medium comprising
    a substrate of a first material
    partially coated with a defined structure of protrusions of a layer of a second material,
    the structure being fabricated by selectively breaking off protrusions of a regular pattern of protrusions,
    each broken off or not broken off protrusion forming a memory element storing one data bit.

15. A data storage medium as claimed in claim 14, wherein said first material is silicon and said second material is silicon oxide.

16. Storage device comprising at least one micro-device, further comprising means for moving said at least one micro-device with respect to a storage medium and controlling means for controlling said at least one micro-device, said controlling means comprising means for controlling said means for moving said at least one micro-device in a manner that protrusions of said storage medium, being separated from a substrate of said storage medium by an interface, are selectively broken off.

17. Use of a method comprising the steps of
    providing a substrate of a first material
    said substrate being partially coated with a defined pattern of protrusions of a layer of a second material, an interface being formed between said substrate and said layer,
    and selectively removing protrusions by means of a micro-device for producing a storage medium.

* * * * *